US010345341B2

(12) United States Patent
Shinagawa et al.

(10) Patent No.: US 10,345,341 B2
(45) Date of Patent: Jul. 9, 2019

(54) EXCITATION CORE, SENSOR HEAD, AND CURRENT SENSOR

(71) Applicants: Yokogawa Electric Corporation, Tokyo (JP); Yokogawa Test & Measurement Corporation, Tokyo (JP)

(72) Inventors: Takanobu Shinagawa, Tokyo (JP); Kiyoshi Yokoshima, Tokyo (JP)

(73) Assignees: Yokogawa Electric Corporation, Musashino-shi, Tokyo (JP); Yokogawa Test & Measurement Corporation, Musashino-shi, Tokyo (JP)

( * ) Notice: Subject to any disclaimer, the term of this patent is extended or adjusted under 35 U.S.C. 154(b) by 2 days.

(21) Appl. No.: 15/730,032

(22) Filed: Oct. 11, 2017

(65) Prior Publication Data
US 2018/0106839 A1    Apr. 19, 2018

(30) Foreign Application Priority Data
Oct. 14, 2016  (JP) .................................. 2016-202923

(51) Int. Cl.
    *G01R 15/18*    (2006.01)
(52) U.S. Cl.
    CPC .................... *G01R 15/18* (2013.01)
(58) Field of Classification Search
    CPC ......... G01R 11/56; G01R 11/57; G01R 11/58; G01R 11/63; G01R 11/64
    USPC ......................................... 324/117 R, 117 H
    See application file for complete search history.

(56) References Cited

U.S. PATENT DOCUMENTS

| 5,767,667 | A  | * | 6/1998 | Shafie | G01R 15/186 |
|           |    |   |        |        | 324/117 R |
| 9,618,541 | B1 | * | 4/2017 | Nguyen | G01R 15/148 |
| 2007/0040554 | A1 | * | 2/2007 | Seki | A61B 5/04005 |
|           |    |   |        |        | 324/318 |

FOREIGN PATENT DOCUMENTS

| JP | 6-260355 A | 9/1994 |
| JP | 2007-057294 A | 3/2007 |

* cited by examiner

*Primary Examiner* — Tung X Nguyen
(74) *Attorney, Agent, or Firm* — Sughrue Mion, PLLC

(57) ABSTRACT

An excitation core includes a first strip-shaped magnetic substance and a second strip-shaped magnetic substance. The first strip-shaped magnetic substance has both ends mutually overlapped with and mutually in contact with both ends of the second strip-shaped magnetic substance in a thickness direction. A sensor head includes this excitation core and a magnetism collecting body. This magnetism collecting body includes strip-shaped first magnetism collector and second magnetism collector. Both ends of the first magnetism collector and both ends of the second magnetism collector are in contact with one another to form the annular magnetism collecting body. This magnetism collecting body is disposed at an inside or an outside of the reinforcing body.

8 Claims, 12 Drawing Sheets

EXCITATION CORE, SENSOR HEAD, AND CURRENT SENSOR

CROSS-REFERENCE TO RELATED APPLICATION

This application claims priority from Japanese Patent Application No. 2016-202923 filed with the Japan Patent Office on Oct. 14, 2016, the entire content of which is hereby incorporated by reference.

BACKGROUND

1. Technical Field

The present disclosure relates to an excitation core, a sensor head, and a current sensor.

2. Description of the Related Art

As a current sensor, for example, there has been known a penetration-type contactless current sensor disclosed in JP-A-2007-057294. The current sensor disclosed in JP-A-2007-057294 causes a measurement target to penetrate an annular excitation core. Measuring a current or a voltage of an excitation coil wound around the excitation core measures a current flowing through the measurement target.

There has been known a flux gate type current detection method as a current measurement method. This method obtains a current signal from a current or a voltage of an excitation coil. Furthermore, a zero-flux method has also been known. This method causes the above-described current to flow through a feedback coil wound around an outside of an excitation coil. The method obtains the current signal from the current flowing through the feedback coil.

As the above-described excitation core, the use of a thin strip-shaped magnetic substance like an amorphous is considered to improve the performance and achieve the cost reduction. In such case, the following method is typically employed. By winding the thin strip-shaped magnetic substance by several times, the thin strip-shaped magnetic substance is stacked into several layers. Thus, the excitation core is created.

SUMMARY

An excitation core includes: a first strip-shaped magnetic substance; and a second strip-shaped magnetic substance. The first strip-shaped magnetic substance has both ends mutually overlapped with and mutually in contact with both ends of the second strip-shaped magnetic substance in a thickness direction.

DESCRIPTION OF THE EMBODIMENTS

Figure 1:
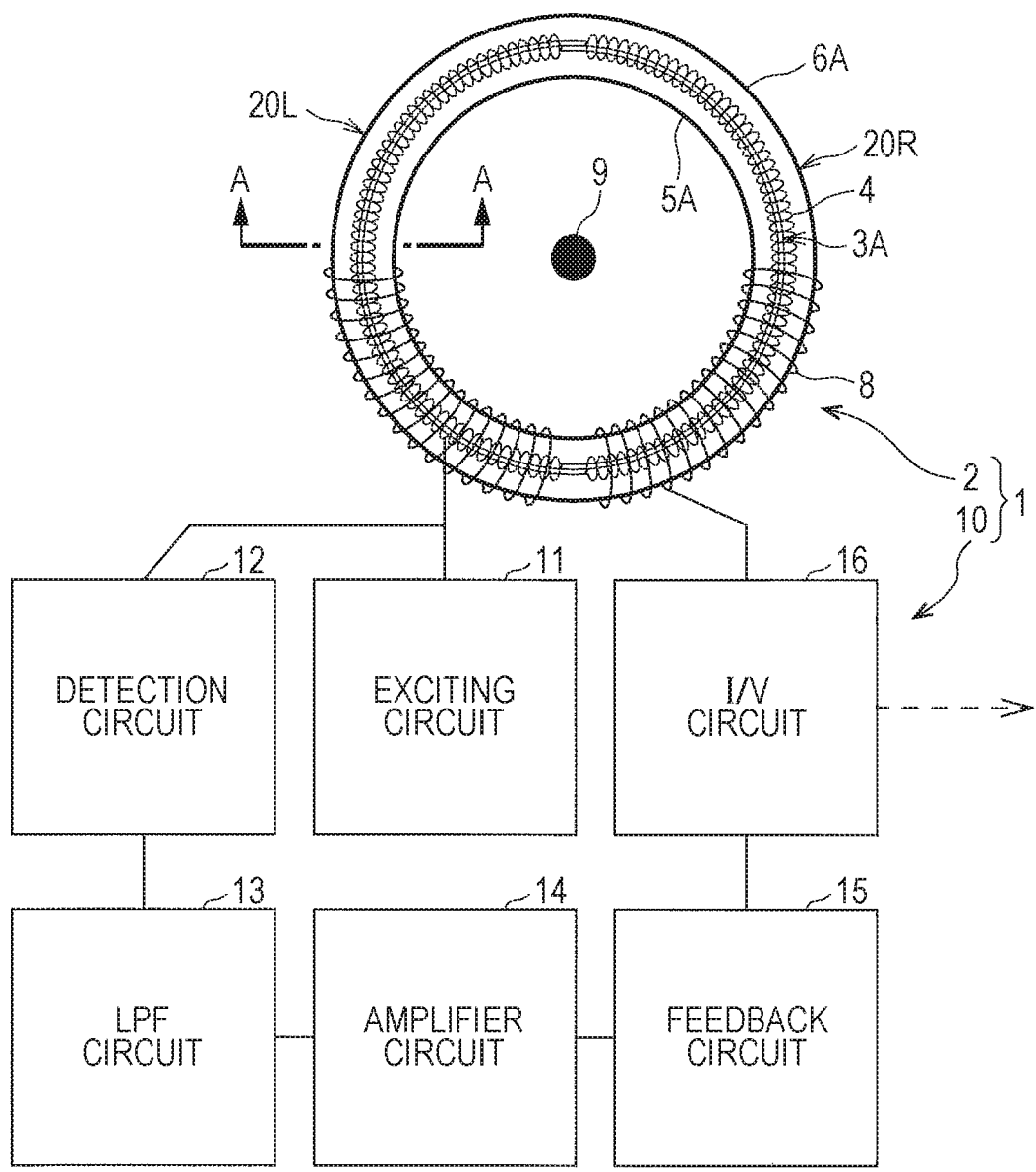
FIG. 1 is a block diagram illustrating one embodiment of a contactless type current sensor of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It is difficult to employ a conventional excitation core to a divided clamp-type contactless current sensor. Because the excitation core constituted of a thin strip-shaped magnetic substance loses performance as the excitation core through the division. The first factor is mechanical strength. A cross-sectional surface of the divided excitation core obtained by winding the thin strip-shaped magnetic substance is made of thin strip-shaped magnetic substances stacked in several layers. Moreover, the cross-sectional surface of each layer has a linear shape. Therefore, when this excitation core is employed to the divided clamp-type contactless current sensor, the mechanical strength of the thin strip-shaped magnetic substance cannot bear opening and closing operations, thereby immediately causing a contact failure.

The second factor is reproducibility of a current measurement value. As described above, only the linear-shaped magnetic substances by the several layers are present on the cross-sectional surfaces of the divided excitation cores. In view of this, in the opening and the closing operations of clamp parts of the divided clamp-type contactless current sensor using this, a contact between the magnetic substances at both cross-sectional surface parts actually becomes a line contact. This means small contacted areas between the magnetic substances. In such case, the reproducibility of magnetic coupling at the contact parts in association with the opening and the closing of the clamp parts is less likely to be obtained. Consequently, obtaining the reproducibility of the current measurement value is difficult.

Due to such circumstances, the use of the thin strip-shaped magnetic substance to the excitation core structure of the divided clamp-type contactless current sensor is difficult.

One object of the present disclosure is to provide an excitation core, a sensor head, and a current sensor that can employ a thin strip-shaped magnetic substance as a divided clamp-type excitation core.

An excitation core according to an aspect of the present disclosure (this excitation core) includes: a first strip-shaped magnetic substance; and a second strip-shaped magnetic substance. The first strip-shaped magnetic substance has both ends mutually overlapped with and mutually in contact with both ends of the second strip-shaped magnetic substance in a thickness direction.

This excitation core may further include a reinforcing body that includes a first reinforcing member and a second reinforcing member made of a non-magnetic material, the both ends of the first reinforcing member and the both ends of the second reinforcing member being overlapped with one another to form the annular reinforcing body. The first strip-shaped magnetic substance may be disposed on the first reinforcing member, and the second strip-shaped magnetic substance may be disposed on the second reinforcing member.

Moreover, the first reinforcing member may have inner surfaces at the both ends overlapped with outer surfaces at the both ends of the second reinforcing member to be opposed to one another, the first strip-shaped magnetic substance may be disposed on an inner surface of the first reinforcing member, and the second strip-shaped magnetic substance may be disposed on an outer surface of the second reinforcing member.

The first reinforcing member and the second reinforcing member may each have a through-hole, the first strip-shaped magnetic substance may pass through the through-hole on the first reinforcing member and may be disposed on an outer surface at one end of the first reinforcing member and on an inner surface at another end of the first reinforcing member, the second strip-shaped magnetic substance may pass through the through-hole on the second reinforcing member and may be disposed on an outer surface at one end of the second reinforcing member and on an inner surface at another end of the second reinforcing member. The first reinforcing member may have the outer surface at the one end overlapped with the inner surface at the other end of the second reinforcing member to be opposed to one another, and the first reinforcing member may have the inner surface at the other end overlapped with the outer surface at the one end of the second reinforcing member to be opposed to one another.

The first reinforcing member may include a first inner reinforcing member and a first outer reinforcing member overlapped with one another in a thickness direction. The second reinforcing member may include a second inner reinforcing member and a second outer reinforcing member overlapped with one another in a thickness direction. The first strip-shaped magnetic substance may be interposed between the first inner reinforcing member and the first outer reinforcing member. The second strip-shaped magnetic substance may be interposed between the second inner reinforcing member and the second outer reinforcing member. A position of an end of the first inner reinforcing member and a position of an end of the first outer reinforcing member may be displaced from one another such that an outer surface at one end and an inner surface at another end of the first strip-shaped magnetic substance are exposed. A position of an end of the second inner reinforcing member and a position of an end of the second outer reinforcing member may be displaced from one another such that an outer surface at one end and an inner surface at another end of the second strip-shaped magnetic substance are exposed. The outer surface at the one end of the first strip-shaped magnetic substance and the inner surface at the other end of the second strip-shaped magnetic substance may be in contact with one another, and the inner surface at the other end of the first strip-shaped magnetic substance and the outer surface at the one end of the second strip-shaped magnetic substance may be in contact with one another.

A sensor head according to an aspect of the present disclosure may include: the above described excitation core; and a magnetism collecting body that includes strip-shaped first magnetism collector and second magnetism collector, the first magnetism collector having both ends mutually in contact with both ends of the second magnetism collector to form the annular magnetism collecting body, the magnetism collecting body being disposed at an inside or an outside of the reinforcing body.

In addition, the first magnetism collector may have an outer surface at one of the both ends overlapped with an inner surface at one of the both ends of the second magnetism collector to be opposed to one another, and the first magnetism collector may have an inner surface at another of the both ends overlapped with an outer surface at another of the both ends of the second magnetism collector to be opposed to one another.

A current sensor according to an aspect of the present disclosure includes: the above-described excitation core; and a current detector configured to detect a current flowing through a measurement target penetrating the excitation core.

With the above-described aspects of the present disclosure, both ends of the first strip-shaped magnetic substance and both ends of the second strip-shaped magnetic substance are overlapped to one another in the thickness direction and are in contact with one another. This ensures maintaining sufficient contacted areas in opening and closing operations of the first strip-shaped magnetic substance and the second strip-shaped magnetic substance. This allows the thin strip-shaped magnetic substance to be used as the divided clamp-type excitation core.

First Embodiment

Figure 2:
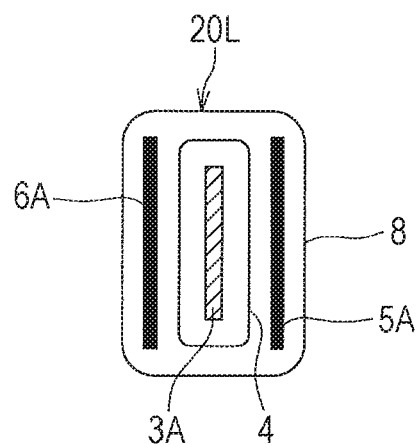
FIG. 2 is a schematic cross-sectional view of a sensor head in FIG. 1 taken along line A-A.

The following describes a contactless type current sensor according to one embodiment of the present disclosure with reference to the drawings. To avoid a complicated drawing, in FIG. 1, a feedback coil 8 is wound around only a part of cores 20L and 20R. Actually, the feedback coil 8 is typically wound around the whole cores 20L and 20R along the circumferential direction. FIGS. 1 and 2 omit a case 7.

A current sensor 1 includes a sensor head 2 and a current detecting circuit 10 as a current detector. With this embodiment, the sensor head 2 can be divided into two, the left core 20L and the right core 20R. The following designates a state where both ends of these left core 20L and right core 20R are coupled to one another to form the annular sensor head 2 as "a clamping (a clamped state)." The following designates a state where the left core 20L and the right core 20R are detached to form the divided sensor heads 2 as "a non-clamping (a non-clamped state)."

As illustrated in FIGS. 1 and 2 and the like, the sensor head 2 includes an annular excitation core 3A, an excitation coil 4, an inner magnetism collecting body 5A, an outer magnetism collecting body 6A, the case 7, and the feedback coil 8. The excitation coil 4 is wound around the excitation core 3A. The inner magnetism collecting body 5A is a magnetism collecting body disposed inside the excitation core 3A. The outer magnetism collecting body 6A is a magnetism collecting body disposed outside the excitation core 3A. The case 7 houses these excitation core 3A, excitation coil 4, inner magnetism collecting body 5A, and outer magnetism collecting body 6A (see FIGS. 4A, 4B, 6A, 6B, 7A, and 7B). The feedback coil 8 is wound around the case 7. A measurement target 9 such as an electric wire is caused to pass through the center of the excitation core 3A.

The current detecting circuit 10, for example, detects a current flowing through the measurement target 9 penetrated in the excitation core 3A. The current detecting circuit 10 includes an exciting circuit 11, a wave detection circuit 12, an LPF circuit 13, an amplifier circuit 14, a feedback circuit 15, and an I/V circuit 16. The excitation coil 4 is coupled to the exciting circuit 11 and is alternatively excited by an alternating exciting current. An exciting voltage or an exciting current of the excitation coil 4 changes by an action of a current flowing through the measurement target 9 (hereinafter referred to as a measured current). The wave detection circuit 12 detects the change in the exciting voltage or the exciting current of the excitation coil 4 and generates a signal according to the detection result. Passing this signal through the LPF circuit 13 obtains the signal proportional to the measured current.

Subsequently, when this signal is amplified by the amplifier circuit 14 and goes through the feedback circuit 15, the current flowing through the feedback coil 8 is generated. The current flowing through the feedback coil 8 generates a magnetic field in the feedback coil 8. Consequently, a magnetic flux occurs in the excitation core 3A, the inner magnetism collecting body 5A, and the outer magnetism collecting body 6A. A direction of the wound wire on the feedback coil 8 is a direction in which the magnetic flux by the current flowing through the feedback coil 8 acts so as to cancel the magnetic flux occurred by the measured current. Therefore, this configuration almost zeros the magnetic flux at the excitation core 3A, the inner magnetism collecting body 5A, and the outer magnetism collecting body 6A in the feedback coil 8. The current flowing through the feedback coil 8 is proportionate to the measured current. In view of this, performing a current-voltage conversion on the current flowing through the feedback coil 8 by the I/V circuit 16 obtains an output voltage, a final estimated value of the measured current.

Figure 3:
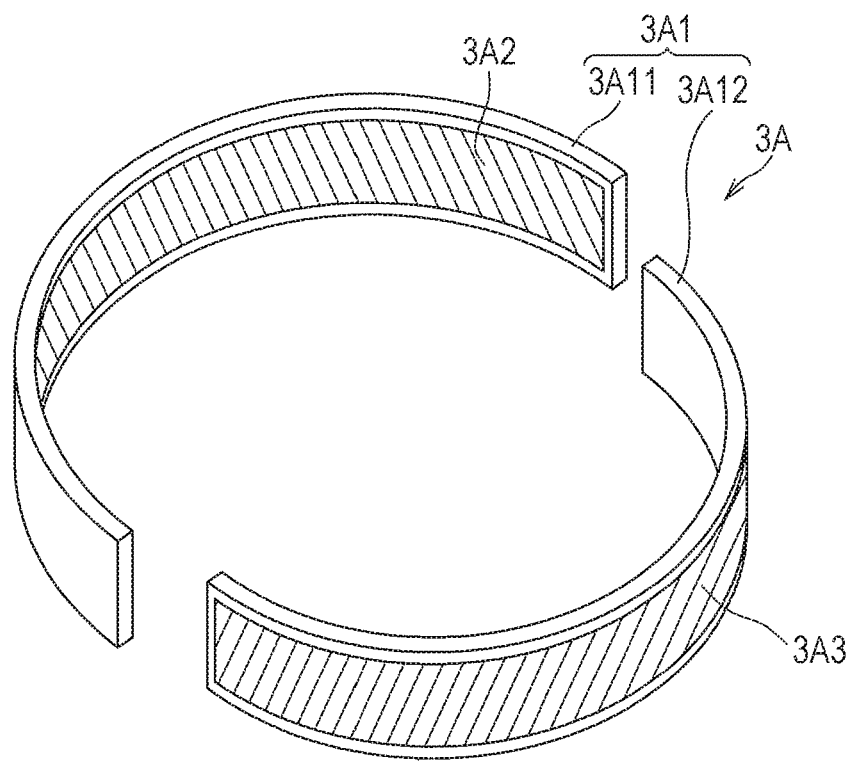
FIG. 3 is a perspective view of an excitation core according to a first embodiment illustrated in FIG. 1.

The following describes a configuration of the excitation core 3A with reference to FIG. 3. The excitation core 3A includes a reinforcing body 3A1, a first strip-shaped magnetic substance 3A2, and a second strip-shaped magnetic substance 3A3. The reinforcing body 3A1 includes U-shaped first reinforcing member 3A11 and second reinforcing member 3A12. The first reinforcing member 3A11 and the second reinforcing member 3A12 are, for example, made of a non-magnetic material (such as a plastic) dividable into two. Overlapping both ends of the first reinforcing member 3A11 and the second reinforcing member 3A12 with one another forms the annular reinforcing body 3A1. In this embodiment, overlapping both ends of the first reinforcing member 3A11 and the second reinforcing member 3A12 to one another forms the annular (the circular) reinforcing body 3A1. The first reinforcing member 3A11 and the second reinforcing member 3A12 are each formed into a U shape along a semicircle.

Figure 5A:
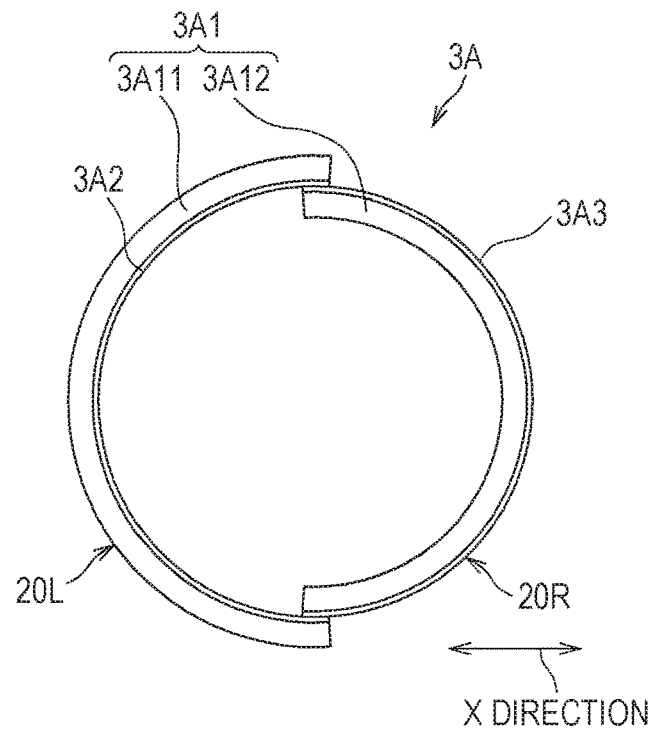
FIG. 5A is a side view of the excitation core illustrated in FIG. 1 during the clamping.
Figure 5B:
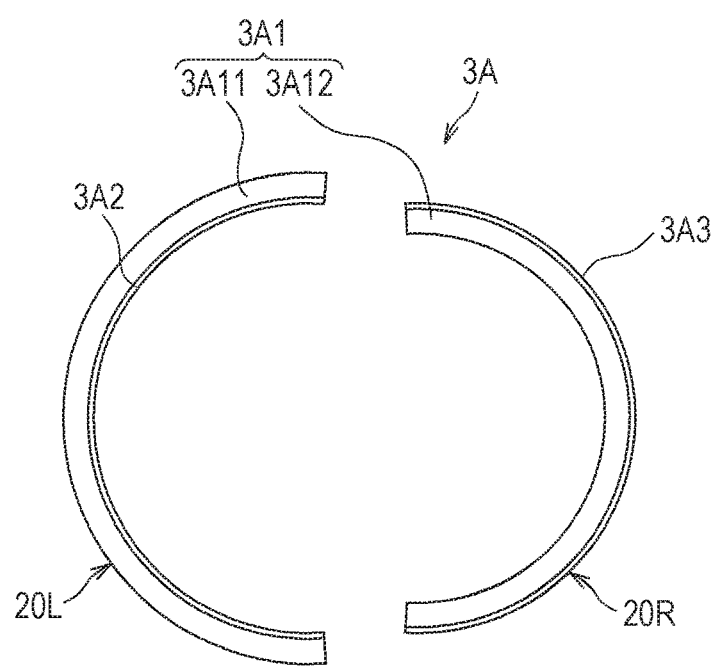
FIG. 5B is a side view of the excitation core illustrated in FIG. 1 during the non-clamping.

The first reinforcing member 3A11 and the second reinforcing member 3A12 are formed into a strip plate shape. The first reinforcing member 3A11 and the second reinforcing member 3A12 are formed into the U shape such that both ends in the longitudinal direction are opposed in the thickness direction. A distance between both ends of the first reinforcing member 3A11 is provided larger than a distance between both ends of the second reinforcing member 3A12. As illustrated in FIGS. 5A and 5B, inner surfaces at both ends of the first reinforcing member 3A11 are overlapped with outer surfaces at both ends of the second reinforcing member 3A12 so as to be opposed to one another. This forms the annular reinforcing body 3A1.

The two dividable first strip-shaped magnetic substance 3A2 and second strip-shaped magnetic substance 3A3 are made of a soft magnetic material. For example, the first strip-shaped magnetic substance 3A2 and the second strip-shaped magnetic substance 3A3 have a thin strip shape (a ribbon shape) with a thickness of 100 μm or less and have flexibility. As illustrated in FIG. 3, the first strip-shaped magnetic substance 3A2 is disposed on the inner surface of the first reinforcing member 3A11 so as to be laid along or be pasted to the inner surface. The second strip-shaped magnetic substance 3A3 is disposed on the outer surface of the second reinforcing member 3A12 so as to be laid along or be pasted to the outer surface.

The first strip-shaped magnetic substance 3A2 is disposed across both ends of the first reinforcing member 3A11 overlapped with the second reinforcing member 3A12. The second strip-shaped magnetic substance 3A3 is also disposed across both ends of the second reinforcing member 3A12 overlapped with the first reinforcing members 3A11. In view of this, as illustrated in FIGS. 5A and 5B, when the inner surfaces at both ends of the first reinforcing member 3A11 are overlapped with the outer surfaces at both ends of the second reinforcing member 3A12 so as to be opposed to one another, both ends of the first strip-shaped magnetic substance 3A2 and both ends of the second strip-shaped magnetic substance 3A3 are overlapped with one another in the thickness direction and are in contact with one another.

Figure 4A:
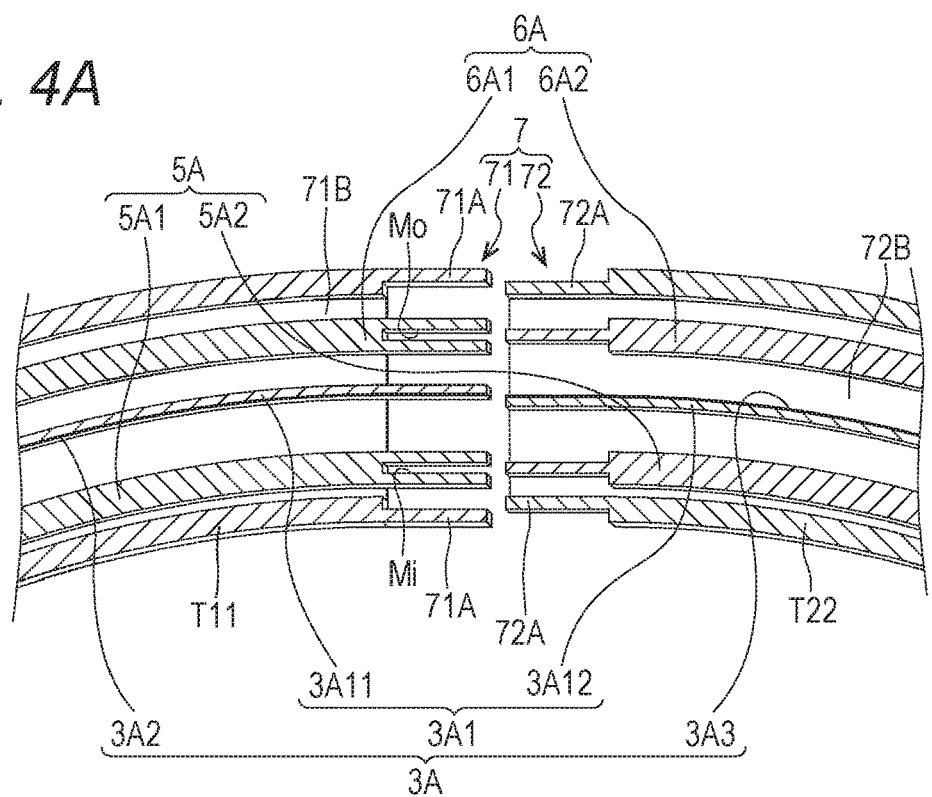
FIG. 4A is a partial cross-sectional view of a sensor head illustrated in FIG. 1 during non-clamping.
Figure 4B:
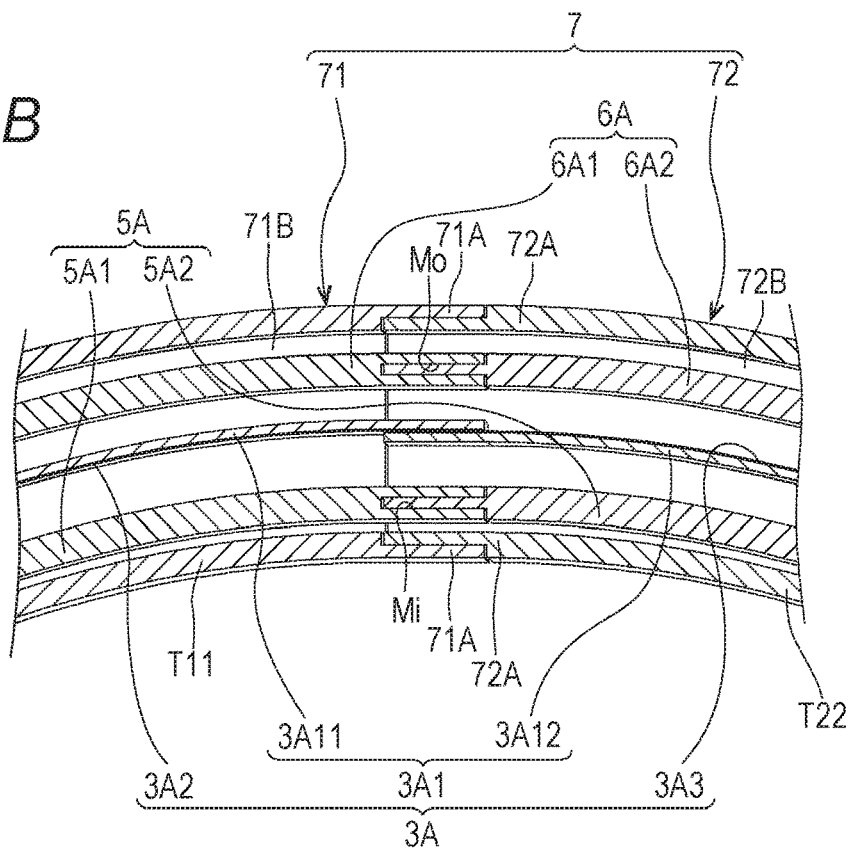
FIG. 4B is a partial cross-sectional view of the sensor head illustrated in FIG. 1 during a clamping.

As illustrated in FIGS. 4A and 4B, the inner magnetism collecting body 5A is divided into two and includes a first inner magnetism collector 5A1 as a first magnetism collector and a second inner magnetism collector 5A2 as a second magnetism collector. The first inner magnetism collector 5A1 and the second inner magnetism collector 5A2 have a strip plate shape (a strip shape). The first inner magnetism collector 5A1 and the second inner magnetism collector 5A2 are formed into a U shape such that both ends in the longitudinal direction are opposed in the thickness direction. Bringing both ends of the first inner magnetism collector 5A1 into contact with both ends of the second inner magnetism collector 5A2 mutually forms the inner magnetism collecting body 5A into the annular shape (the circular shape).

Figure 6A:
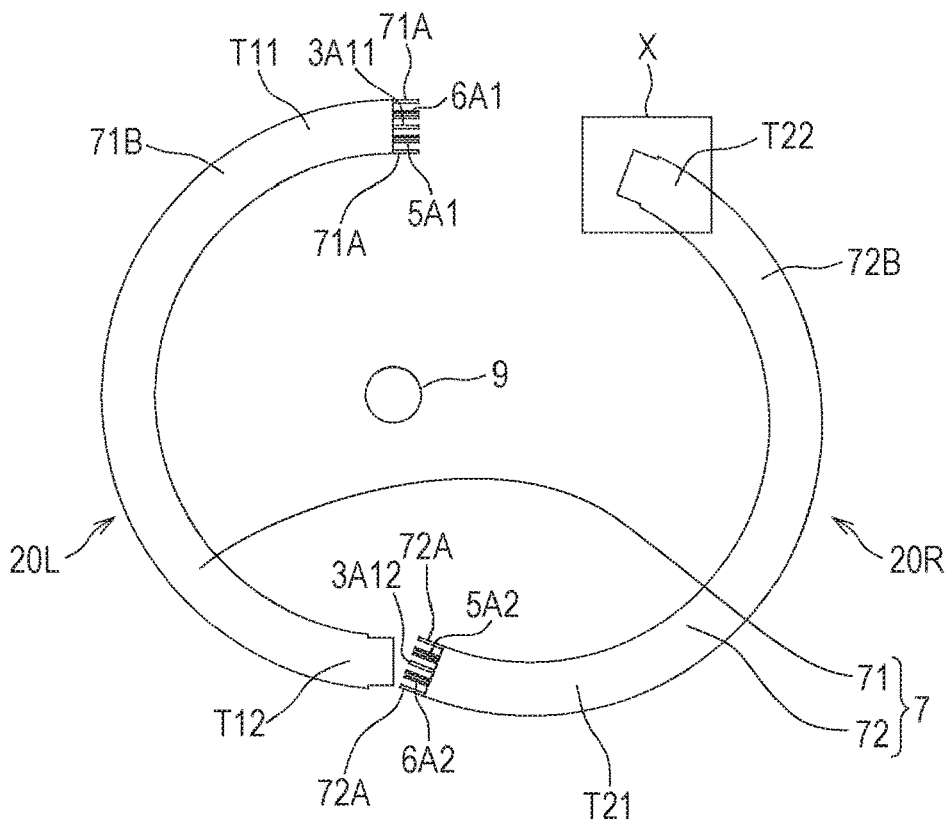
FIG. 6A is a side view of the sensor head.
Figure 6B:
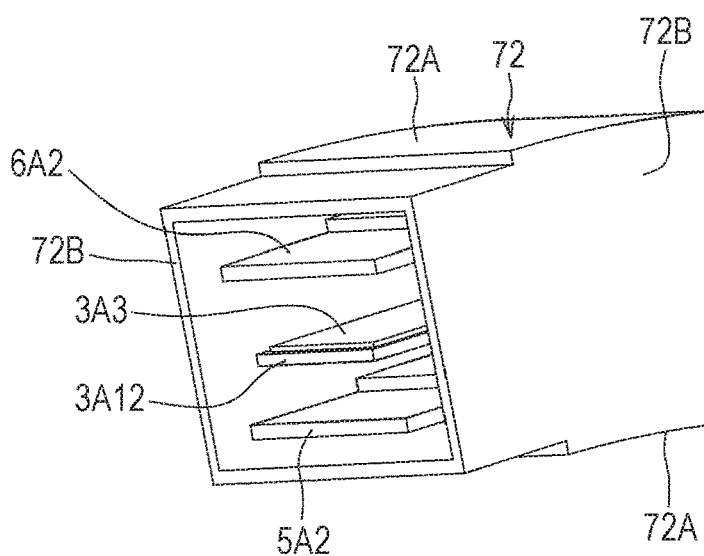
FIG. 6B is a partial perspective view of a part X in FIG. 6A.

As illustrated in FIGS. 4A and 4B, grooves Mi along a strip width direction are formed on an end surface on a one end T11 side of the first inner magnetism collector 5A1 and an end surface on a one end T21 side of the second inner magnetism collector 5A2 (FIGS. 6A and 6B). Meanwhile, an end surface on another end T12 side of the first inner magnetism collector 5A1 and an end surface on another end T22 side of the second inner magnetism collector 5A2 (FIGS. 6A and 6B) have thin thicknesses so as to fit to these grooves Mi.

The outer magnetism collecting body 6A is divided into two and includes a first outer magnetism collector 6A1 as a first magnetism collector and a second outer magnetism collector 6A2 as a second magnetism collector. The first outer magnetism collector 6A1 and the second outer magnetism collector 6A2 have a strip plate shape (a strip shape). The first outer magnetism collector 6A1 and the second outer magnetism collector 6A2 are formed into a U shape such that both ends in the longitudinal direction are opposed. Bringing both ends of the first outer magnetism collector 6A1 into contact with both ends of the second outer magnetism collector 6A2 mutually forms the outer magnetism collecting body 6A into the annular shape (the circular shape).

Grooves Mo along the strip width direction are formed as illustrated in FIGS. 4A and 4B on an end surface on the one end T11 side of the first outer magnetism collector 6A1 and an end surface on the one end T21 side of the second outer magnetism collector 6A2 (FIGS. 6A and 6B). Meanwhile, an end surface on the other end T12 side of the first outer magnetism collector 6A1 and an end surface on the other end T22 side of the second outer magnetism collector 6A2 (FIGS. 6A and 6B) have thin thicknesses so as to fit to these grooves Mo.

As illustrated in FIGS. 6A, 6B, 7A, and 7B, the case 7 is divided into two and includes a first case 71 and a second case 72. The first case 71 and the second case 72 have a square cylindrical shape. The first case 71 and the second case 72 are formed into a U shape such that both ends in the longitudinal direction are opposed. The above-described first reinforcing member 3A11, first strip-shaped magnetic substance 3A2, first inner magnetism collector 5A1, and first outer magnetism collector 6A1 are stacked in the thickness direction in the first case 71 and form the left core 20L. The above-described second reinforcing member 3A12, second strip-shaped magnetic substance 3A3, second inner magnetism collector 5A2, and second outer magnetism collector 6A2 are stacked in the thickness direction in the second case 72 and form the right core 20R.

Figure 7A:
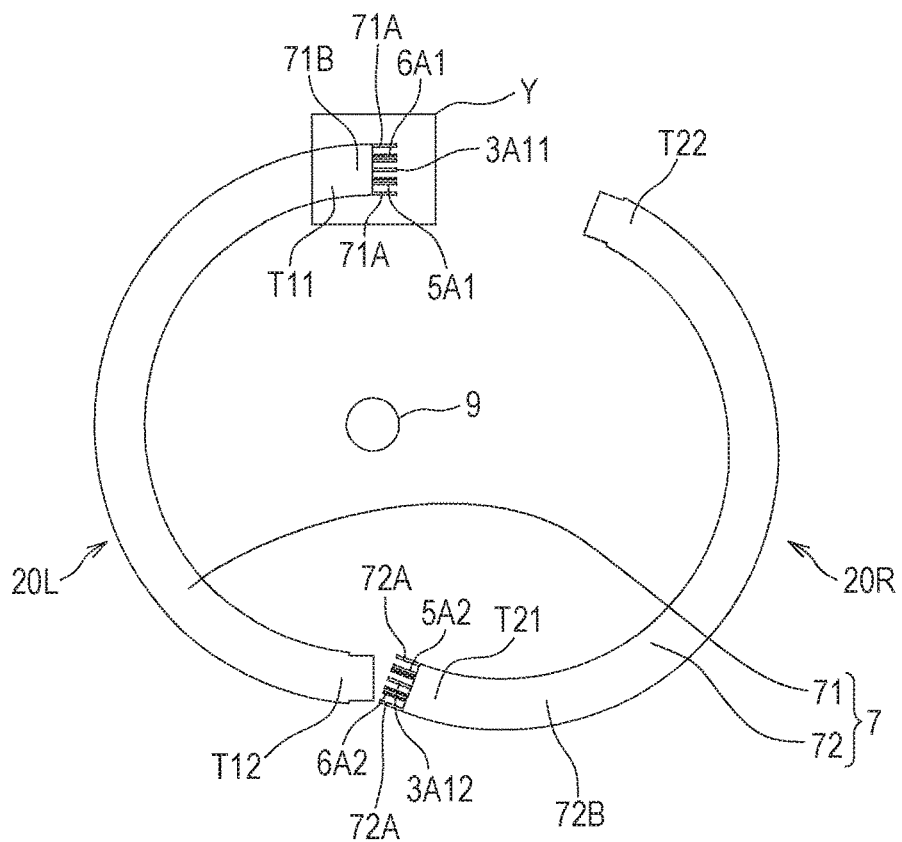
FIG. 7A is a side view of the sensor head.
Figure 7B:
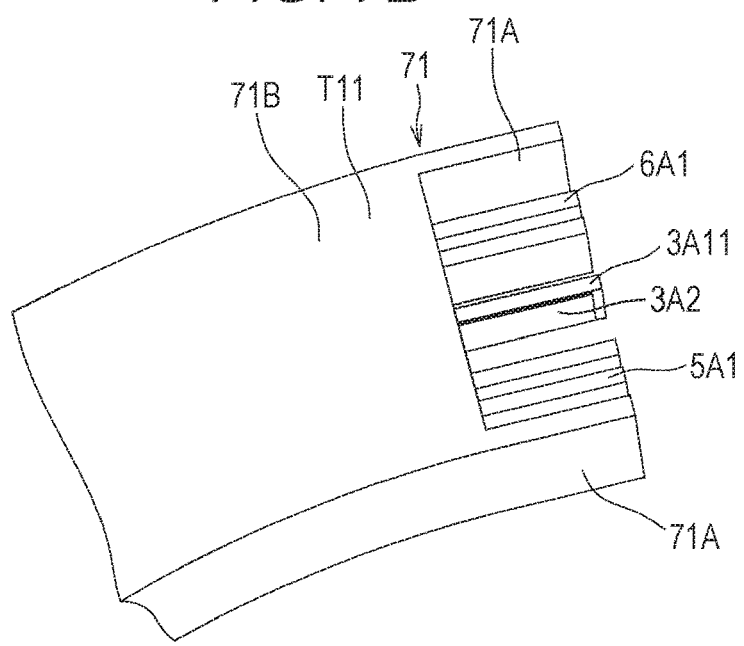
FIG. 7B is a partial perspective view of a part Y in FIG. 7A.
Figure 8A:
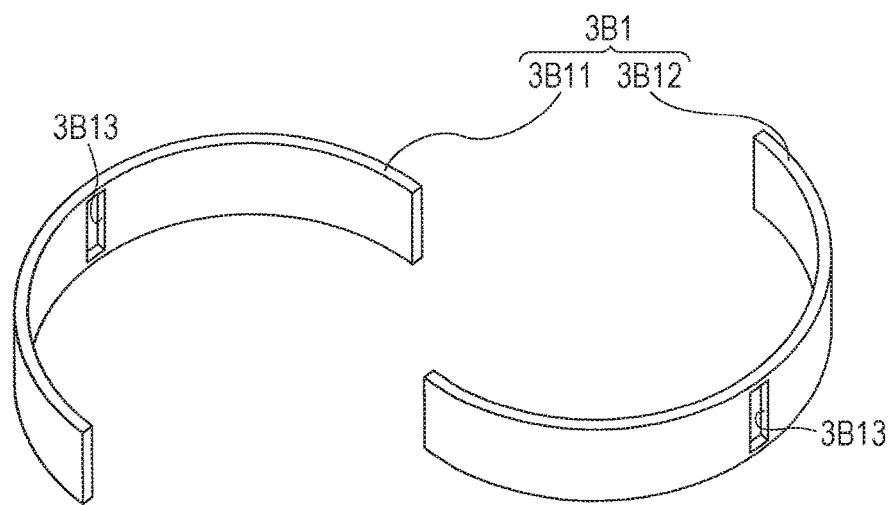
FIG. 8A is a perspective view of a first reinforcing member and a second reinforcing member constituting the excitation core illustrated in FIG. 1 of a second embodiment.
Figure 8B:
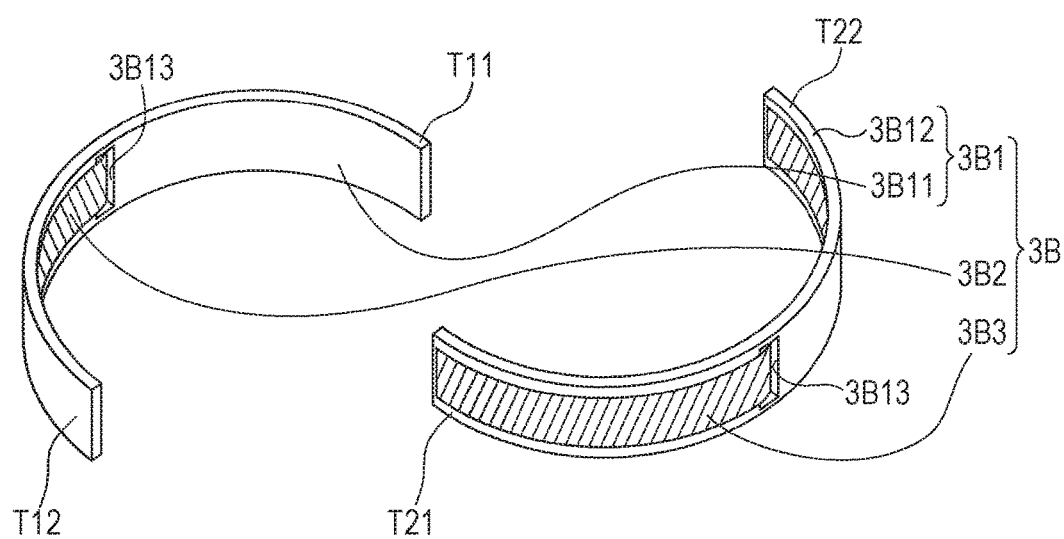
FIG. 8B is a perspective view of the excitation core illustrated in FIG. 1 of the second embodiment.

As illustrated in FIGS. 4A, 4B, 6A, 6B, 7A, and 7B, two walls 71A at the one end T11 of the first case 71 opposed in the thickness direction are formed thinner than other parts so as to be concave on the inside. Furthermore, two walls 72A at the one end T21 of the second case 72 opposed in the thickness direction are formed thinner than other parts so as to be concave on the inside. As illustrated in FIGS. 7A and 7B and the like, two walls 71B at the one end T11 of the first case 71 opposed in the width direction are notched. Furthermore, two walls 72B at the one end T21 of the second case 72 opposed in the width direction are notched.

The two walls 71A at the other end T12 of the first case 71 opposed in the thickness direction are formed thinner than other parts so as to be concave on the outside. Furthermore, the two walls 72A at the other end T22 of the second case 72 opposed in the thickness direction are formed thinner than other parts so as to be concave on the outside.

The above-described both ends of the first reinforcing member 3A11 and the second reinforcing member 3A12, both ends of the first inner magnetism collector 5A1 and the second inner magnetism collector 5A2, both ends of the first outer magnetism collector 6A1 and the second outer magnetism collector 6A2, and both ends of the first case 71 and the second case 72 are formed into a straight line shape (a flat plate shape), not an arc shape along the right core 20R and the left core 20L.

As illustrated in FIGS. 4A and 5B, with the above-described configuration, separating the left core 20L from the right core 20R divides the excitation core 3A into two, making the excitation core 3A into the non-clamped state. Afterwards, the measurement target 9 is passed through from a clearance between the left core 20L and the right core 20R divided into two. Afterwards, the one end T11 of the first case 71 and the other end T22 of the second case 72 are approximated to one another, and the other end T12 of the first case 71 and the one end T21 of the second case 72 are approximated to one another. As illustrated in FIGS. 4A and 4B, doing so fits the walls 71A at the one end T11 of the first case 71 and the walls 72A at the other end T22 of the second case 72 to one another. Furthermore, the wall 72B is fitted to the cutout of the wall 71B.

The other end T22 side of the second inner magnetism collector 5A2 and the other end T12 side of the first inner magnetism collector 5A1 are inserted into the groove Mi disposed at the one end T11 side of the first inner magnetism collector 5A1 and the groove Mi disposed at the one end T21 side of the second inner magnetism collector 5A2, respectively. Thus, both ends of the first inner magnetism collector 5A1 and the second inner magnetism collector 5A2 are coupled to one another. The other end T22 side of the second outer magnetism collector 6A2 and the other end T12 side of the first outer magnetism collector 6A1 are inserted into the groove Mo disposed at the one end T11 side of the first outer magnetism collector 6A1 and the groove Mo disposed at the one end T21 side of the second outer magnetism collector 6A2, respectively. Thus, both ends of the first outer magnetism collector 6A1 and the second outer magnetism collector 6A2 are coupled to one another.

Both ends of the first reinforcing member 3A11 and the second reinforcing member 3A12 are overlapped with and are in contact with one another in the thickness direction. Accordingly, both ends of the first strip-shaped magnetic substance 3A2 and the second strip-shaped magnetic substance 3A3 are overlapped and in contact with one another in the thickness direction (the thickness direction of the first strip-shaped magnetic substance 3A2 and the second strip-shaped magnetic substance 3A3). Consequently, one magnetic circuit is configured. This makes the annular sensor head 2 into the clamped state, and the measurement target 9 is penetrated through the center.

With the above-described first embodiment, both ends of the first strip-shaped magnetic substance 3A2 and the second strip-shaped magnetic substance 3A3 are overlapped with and are in contact with one another in the thickness direction. Accordingly, regarding the opening and the closing operations of the first strip-shaped magnetic substance 3A2 and the second strip-shaped magnetic substance 3A3, the sufficient contacted areas can be maintained. In view of this, as the divided clamp-type excitation core 3A, the thin strip-shaped magnetic substances are applicable.

With the above-described first embodiment, the first strip-shaped magnetic substance 3A2 is disposed on the first reinforcing member 3A11. Furthermore, the second strip-shaped magnetic substance 3A3 is disposed on the second reinforcing member 3A12. Accordingly, even the flexible first strip-shaped magnetic substance 3A2 and second strip-shaped magnetic substance 3A3 can maintain their shapes. Therefore, the mechanical strength can be increased without affecting the properties of the excitation core 3A.

With the above-described first embodiment, both ends of the first inner magnetism collector 5A1 and both ends of the second inner magnetism collector 5A2 are overlapped in the thickness direction. Furthermore, both ends of the first outer magnetism collector 6A1 and both ends of the second outer magnetism collector 6A2 are overlapped in the thickness direction. This ensures increasing the contacted areas between the mutual end surfaces of the first inner magnetism collector 5A1 and the second inner magnetism collector 5A2 and the contacted areas between the mutual end surfaces of the first outer magnetism collector 6A1 and the second outer magnetism collector 6A2 compared with the case where these end surfaces are bumped against and are in contact with one another.

While the excitation core 3A of the above-described first embodiment has the circular shape, the shape is not limited to this. It is only necessary that the excitation core 3A has the shape with which both ends of the first strip-shaped magnetic substance 3A2 and the second strip-shaped magnetic substance 3A3 can be in contact with one another in the thickness direction. The shape may be a rectangular shape or may be a shape combining a straight line and a curved line.

Second Embodiment

The following describes the contactless type current sensor 1 of the second embodiment with reference to FIGS. 8A, 8B, 9A, and 9B. The difference between the first embodiment and the second embodiment is a configuration of an excitation core 3B. The parts other than the excitation core 3B are similar to the first embodiment, and therefore will not be further elaborated here.

The excitation core 3B includes a reinforcing body 3B1, a first strip-shaped magnetic substance 3B2, and a second strip-shaped magnetic substance 3B3. The reinforcing body 3B1 includes U-shaped first reinforcing member 3B11 and second reinforcing member 3B12. The first reinforcing member 3B11 and the second reinforcing member 3B12 are, for example, made of a non-magnetic material (such as a plastic) dividable into two. Overlapping both ends of the first reinforcing member 3B11 and the second reinforcing member 3B12 with one another forms the annular reinforcing body 3B1.

The first reinforcing member 3B11 and the second reinforcing member 3B12 are formed into a strip plate shape. The first reinforcing member 3B11 and the second reinforcing member 3B12 are formed into the U shape such that both ends in the longitudinal direction are opposed in the thickness direction. The first reinforcing member 3B11 and the second reinforcing member 3B12 have the sizes and the shapes identical to one another and have through-holes 3B13 at the centers in the longitudinal direction. The first strip-shaped magnetic substance 3B2 and the second strip-shaped magnetic substance 3B3 are passed through the through-holes 3B13. As illustrated in FIGS. 8A, 8B, 9A, and 9B, the outer surface at the one end T11 of the first reinforcing member 3B11 is overlapped with the inner surface at the other end T22 of the second reinforcing member 3B12 so as to be opposed to one another. Furthermore, the inner surface at the other end T12 of the first reinforcing member 3B11 is overlapped with the outer surface at the one end T21 of the second reinforcing member 3B12 so as to be opposed to one another. This forms the annular reinforcing body 3B1.

Figure 9A:
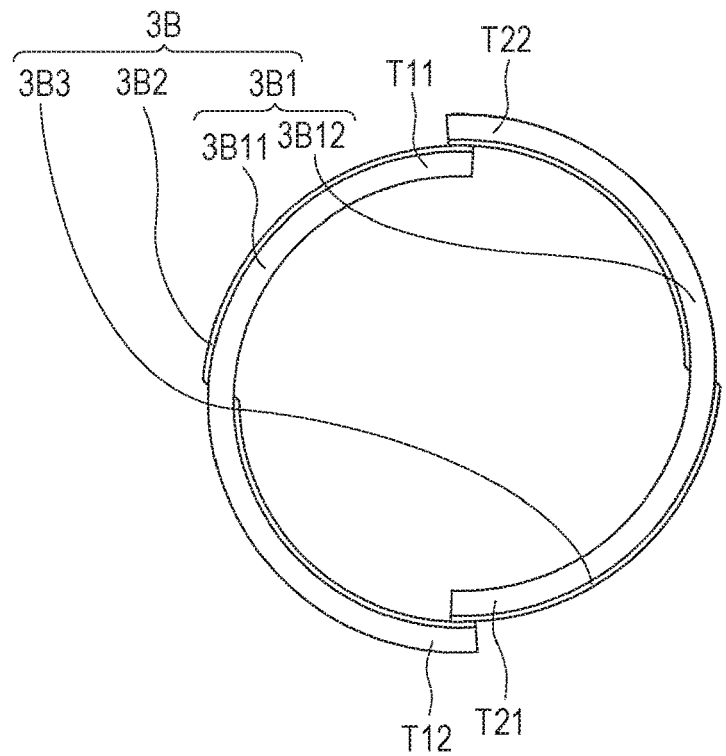
FIG. 9A is a side view of the excitation core illustrated in FIGS. 8A and 8B during the clamping.
Figure 9B:
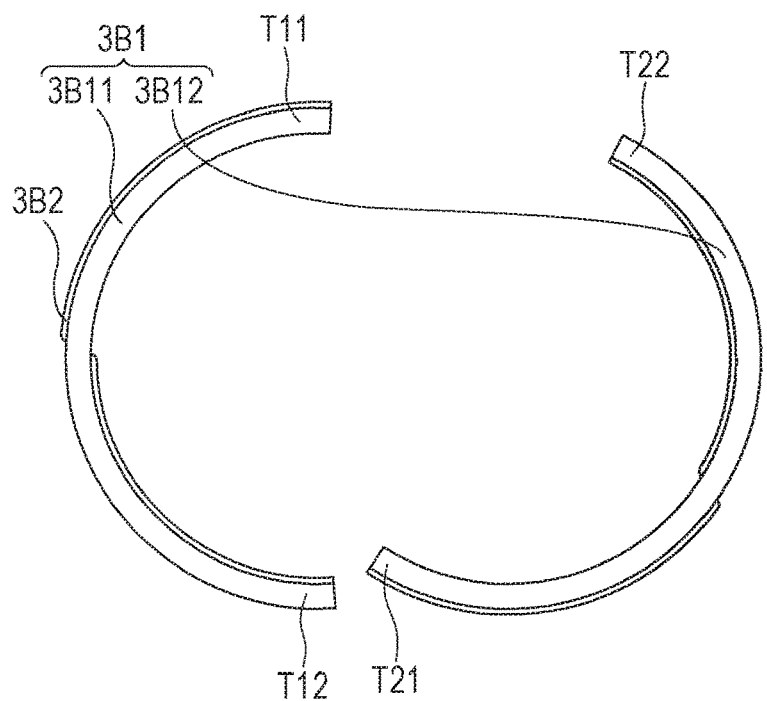
FIG. 9B is a side view of the excitation core illustrated in FIGS. 8A and 8B during the non-clamping.
Figure 10A:
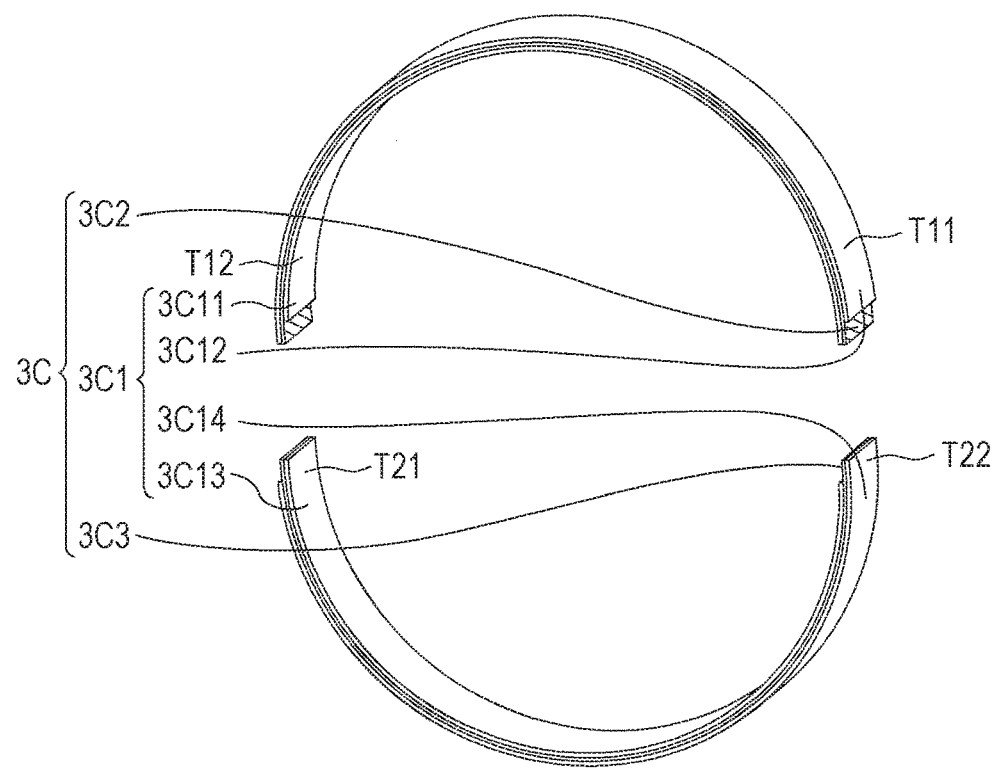
FIGS. 10A and 10B are perspective views of the excitation core illustrated in FIG. 1 of a third embodiment.
Figure 10B:
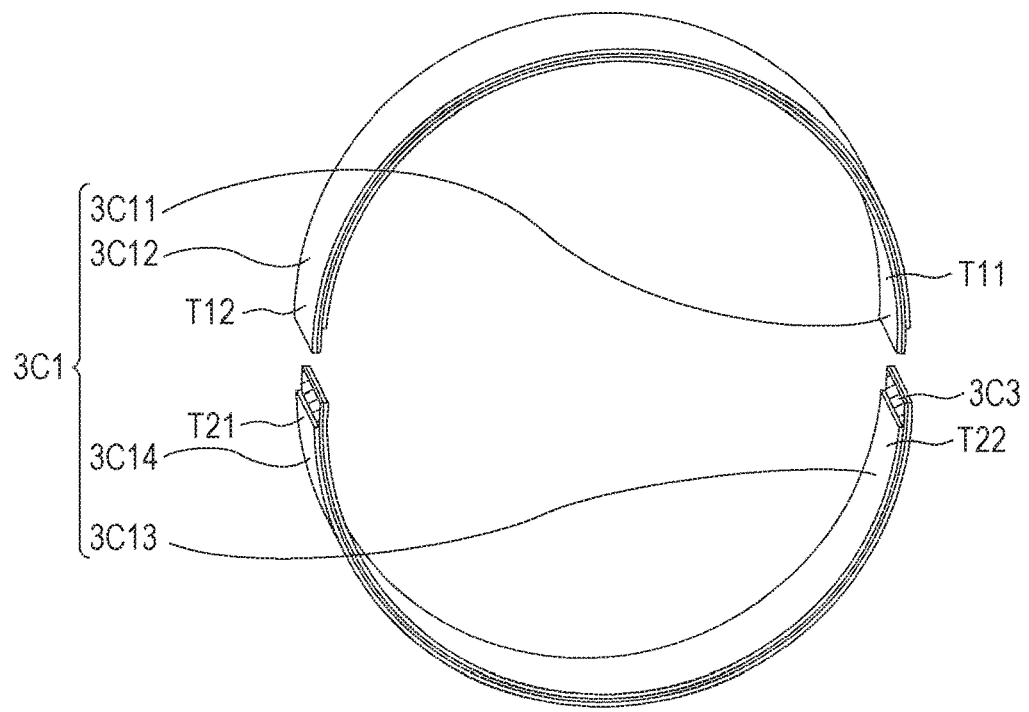

The first strip-shaped magnetic substance 3B2 and the second strip-shaped magnetic substance 3B3 divided into two, similar to the first embodiment, for example, have the thin strip shape with a thickness of 100 μm or less and have flexibility. As illustrated in FIGS. 8A, 8B, 9A, and 9B, the first strip-shaped magnetic substance 3B2 is disposed so as to pass through the through-hole 3B13 on the first reinforcing member 3B11 and be laid along or be pasted to the outer surface at the one end T11 of the first reinforcing member 3B11 and the inner surface at the other end T12 of the first reinforcing member 3B11. The second strip-shaped magnetic substance 3B3 is disposed so as to pass through the through-hole 3B13 on the second reinforcing member 3B12 and be laid along or be pasted to the outer surface at the one end T21 of the second reinforcing member 3B12 and the inner surface at the other end T22 of the second reinforcing member 3B12. The first strip-shaped magnetic substance 3B2 is disposed across both ends of the first reinforcing member 3B11 overlapped with the second reinforcing member 3B12. The second strip-shaped magnetic substance 3B3 is also disposed across both ends of the second reinforcing member 3B12 overlapped with the first reinforcing member 3B11. In view of this, as illustrated in FIGS. 9A and 9B, when both ends of the first reinforcing member 3B11 and both ends of the second reinforcing member 3B12 are overlapped with one another, both ends of the first strip-shaped magnetic substance 3B2 and both ends of the second strip-shaped magnetic substance 3B3 are overlapped in the thickness direction and are in contact with one another.

The above-described second embodiment can make the sizes and the shapes of the first reinforcing member 3B11 and the second reinforcing member 3B12 identical, different from the first embodiment. This ensures a cost reduction.

Moreover, in the case where the left core 20L is separated from the right core 20R with the first embodiment, as illustrated in FIGS. 5A and 5B, one of the left core 20L and the right core 20R is moved in the X direction, which is the direction that the centers of the left core 20L and the right core 20R are opposed to one another. Here, for ease of the explanation, the following describes the case of moving the right core 20R. In this case, the right core 20R is moved by a distance equal to or more than the width of the measurement target 9 in the X-direction.

Therefore, to reduce an amount of movement of the right core 20R, it is considered that after the right core 20R is moved in the X-direction and both ends of the left core 20L and the right core 20R are separated from one another, the other end T22 is rotated around the one end T21 of the right core 20R. However, this uses two-stage operations; after the right core 20R is once moved in the X-direction, the other end T22 is rotated. This makes the opening and the closing operations of the sensor head 2 complicated. In view of this, a mechanism to achieve the opening and the closing operations becomes complicated, increasing the number of components. This increases the cost, the occupied volume, and a risk of a failure.

In contrast to this, as illustrated in FIGS. 9A and 9B, even if the right core 20R is rotated in the clamped state in above-described second embodiment, the right core 20R is less likely to interfere with the left core 20L. This allows opening and closing the sensor head 2 by one action, only the rotation of the right core 20R. This ensures simplifying the mechanism to achieve the opening and the closing operations of the sensor head 2. Consequently, the number of components can be reduced. Furthermore, this can reduce the cost, the occupied volume, and the risk of the failure.

With the above-described second embodiment, the positions of the through-holes 3B13 are at the centers on the first reinforcing member 3B11 and the second reinforcing member 3B12 in the longitudinal direction; however, the positions are not limited to these positions. The positions of the through-holes 3B13 may be close to one sides of the first reinforcing member 3B11 and the second reinforcing member 3B12 in the longitudinal direction and are not limited to the centers. The shapes of the through-holes 3B13 are also not limited to the square. It is only necessary that the through-holes 3B13 have the shapes with which the first strip-shaped magnetic substance 3B2 and the second strip-shaped magnetic substance 3B3 are passable.

Third Embodiment

The following describes the contactless type current sensor 1 according to the third embodiment with reference to FIGS. 10A, 10B, 11A, and 11B. The difference between the first embodiment and the third embodiment is a configuration of an excitation core 3C. The parts other than the excitation core 3C are similar to the first embodiment, and therefore will not be further elaborated here.

The excitation core 3C includes a reinforcing body 3C1, a first strip-shaped magnetic substance 3C2, and a second strip-shaped magnetic substance 3C3. The reinforcing body 3C1 includes U-shaped first inner reinforcing member 3C11 and first outer reinforcing member 3C12 (=a pair of first reinforcing members) and U-shaped second inner reinforcing member 3C13 and second outer reinforcing member 3C14 (=a pair of second reinforcing members). The first inner reinforcing member 3C11, the first outer reinforcing member 3C12, the second inner reinforcing member 3C13, and the second outer reinforcing member 3C14 are, for example, made of the non-magnetic material (such as the plastic). The first inner reinforcing member 3C11 and the first outer reinforcing member 3C12 are overlapped in the thickness direction displaced in the longitudinal direction. That is, the first inner reinforcing member 3C11 is overlapped with the first outer reinforcing member 3C12 such that the first inner reinforcing member 3C11 projects with respect to the first outer reinforcing member 3C12 at the one end T11 and the first outer reinforcing member 3C12 projects with respect to the first inner reinforcing member 3C11 at the other end T12.

The second inner reinforcing member 3C13 and the second outer reinforcing member 3C14 are also overlapped in the thickness direction displaced in the longitudinal direction. That is, the second inner reinforcing member 3C13 is overlapped with the second outer reinforcing member 3C14 such that the second inner reinforcing member 3C13 projects with respect to the second outer reinforcing member 3C14 at the one end T21 and the second outer reinforcing member 3C14 projects with respect to the second inner reinforcing member 3C13 at the other end T22. Both ends of the first inner reinforcing member 3C11 and the first outer reinforcing member 3C12 and both ends of the second inner reinforcing member 3C13 and the second outer reinforcing member 3C14 are overlapped with one another to annularly form the reinforcing body 3C1. At this time, the outer surface at the one end T11 of the first inner reinforcing member 3C11 is opposed to the inner surface at the other end T22 of the second outer reinforcing member 3C14. The inner surface at the other end T12 of the first outer reinforcing member 3C12 is opposed to the outer surface at the one end T21 of the second inner reinforcing member 3C13.

The first strip-shaped magnetic substance 3C2 and the second strip-shaped magnetic substance 3C3, similar to the first embodiment, for example, have the thin strip shape with a thickness of 100 μm or less and have flexibility. The first strip-shaped magnetic substance 3C2 is disposed so as to be interposed between the first inner reinforcing member 3C11 and the first outer reinforcing member 3C12. The second strip-shaped magnetic substance 3C3 is disposed so as to be interposed between the second inner reinforcing member 3C13 and the second outer reinforcing member 3C14. As described above, the position of the end of the first inner reinforcing member 3C11 and the position of the end of the first outer reinforcing member 3C12 are displaced from one another such that the outer surface at the one end T11 and the inner surface at the other end T12 of the first strip-shaped magnetic substance 3C2 are exposed to one another. That is, both ends of the first strip-shaped magnetic substance 3C2 are not interposed between the first inner reinforcing member 3C11 and the first outer reinforcing member 3C12. The outer surface at the one end T11 and the inner surface at the other end T12 of the first strip-shaped magnetic substance 3C2 are exposed.

The position of the end of the second inner reinforcing member 3C13 and the position of the end of the second outer reinforcing member 3C14 are displaced from one another such that the outer surface at the one end T21 and the inner surface at the other end T22 of the second strip-shaped magnetic substance 3C3 are exposed. That is, both ends of the second strip-shaped magnetic substance 3C3 are not interposed between the second inner reinforcing member 3C13 and the second outer reinforcing member 3C14. The outer surface at the one end T21 and the inner surface at the other end T22 of the second strip-shaped magnetic substance 3C3 are exposed.

Figure 11A:
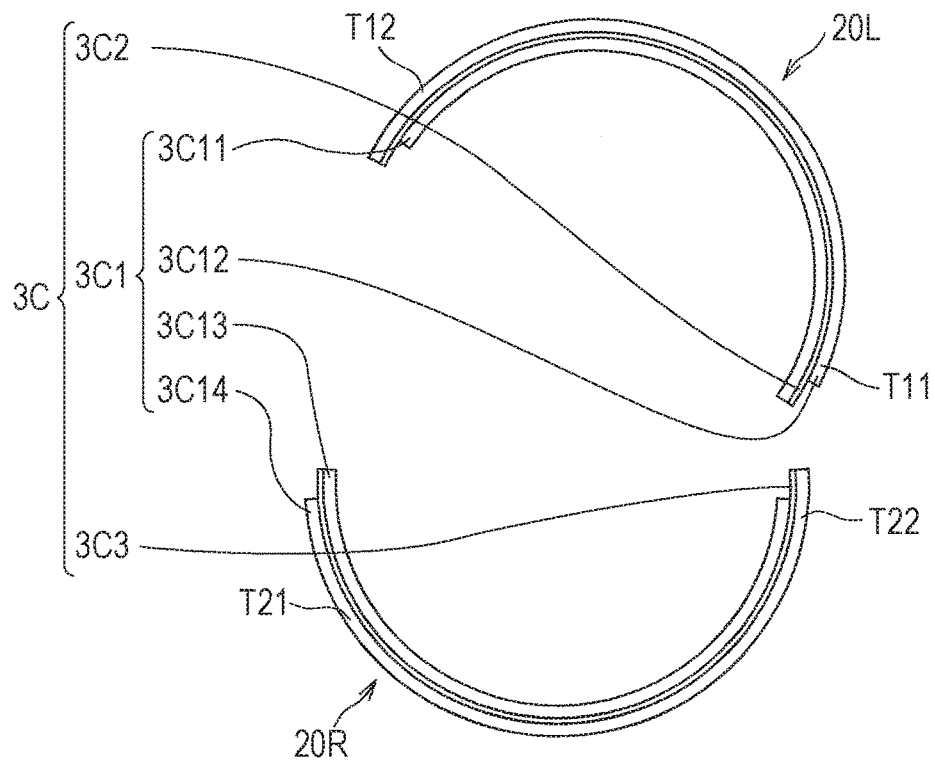
FIG. 11A is a side view of the excitation core illustrated in FIGS. 10A and 10B during the non-clamping.
Figure 11B:
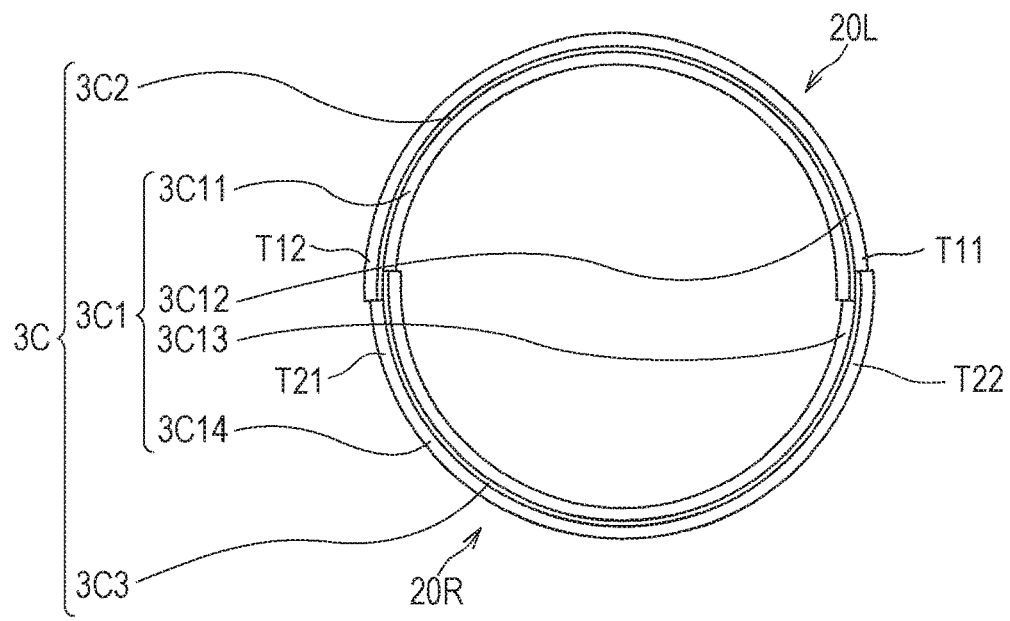
FIG. 11B is a side view of the excitation core illustrated in FIGS. 10A and 10B during the clamping.

In view of this, as illustrated in FIGS. 11A and 11B, overlapping both ends of the first inner reinforcing member 3C11 and the first outer reinforcing member 3C12 and both ends of the second inner reinforcing member 3C13 and the second outer reinforcing member 3C14 overlaps the outer surface at the one end T11 of the first strip-shaped magnetic substance 3C2 and the inner surface at the other end T22 of the second strip-shaped magnetic substance 3C3 in the thickness direction, and the outer surface and the inner surface are in contact with one another. Furthermore, the inner surface at the other end T12 of the first strip-shaped magnetic substance 3C2 and the outer surface at the one end T21 of the second strip-shaped magnetic substance 3C3 are overlapped in the thickness direction and are in contact with one another.

The above-described third embodiment, similar to the second embodiment, allows opening and closing the sensor head 2 by one action, only the rotation of the left core 20L. This ensures simplifying the mechanism to achieve the opening and the closing operations of the sensor head 2. Consequently, the number of components can be reduced. Furthermore, this can reduce the cost, the occupied volume, and the risk of the failure.

Fourth Embodiment

Figure 12:
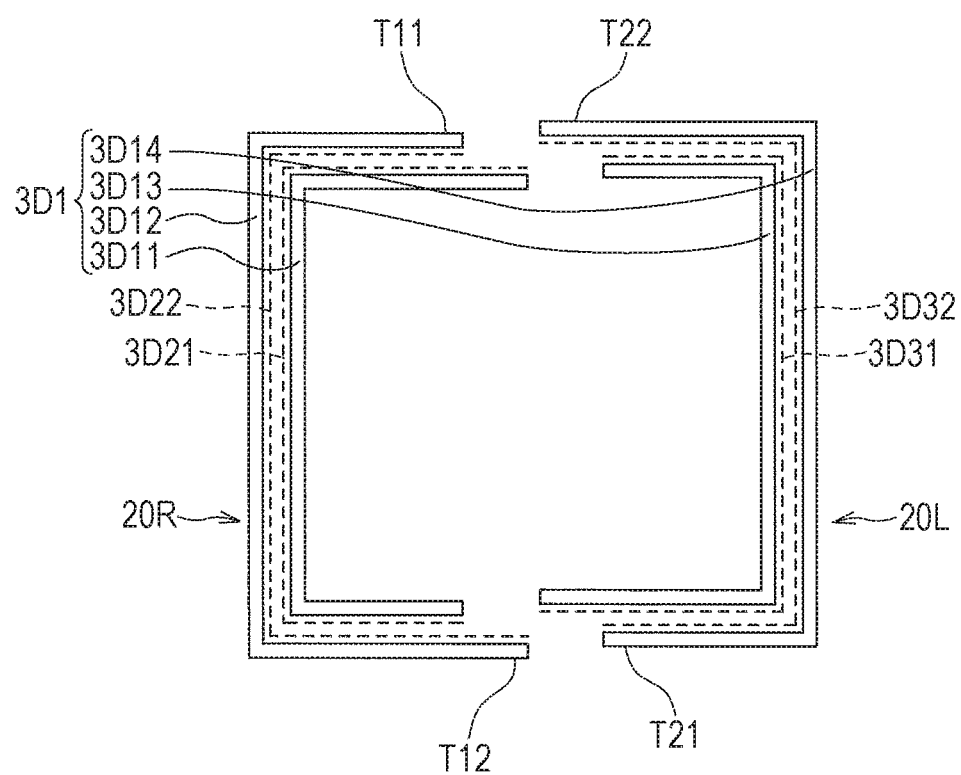
FIG. 12 is a schematic cross-sectional view of the excitation core illustrated in FIG. 1 of a fourth embodiment.

The following describes the contactless type current sensor 1 of the fourth embodiment with reference to FIG. 12. The difference between the first embodiment and the fourth embodiment is a configuration of an excitation core 3D. The parts other than the excitation core 3D are similar to the first embodiment, and therefore will not be further elaborated here.

The excitation core 3D includes a reinforcing body 3D1, a first inner strip-shaped magnetic substance 3D21, a first outer strip-shaped magnetic substance 3D22, a second inner strip-shaped magnetic substance 3D31, and a second outer strip-shaped magnetic substance 3D32. The reinforcing body 3D1 includes squared-U-shaped (or U-shaped) first inner reinforcing member 3D11 and first outer reinforcing member 3D12 (=a pair of first reinforcing members) and squared-U-shaped (or U-shaped) second inner reinforcing member 3D13 and second outer reinforcing member 3D14 (=a pair of second reinforcing members). The first inner reinforcing member 3D11, the first outer reinforcing member 3D12, the second inner reinforcing member 3D13, and the second outer reinforcing member 3D14 are, for example, made of the non-magnetic material (such as the plastic). Both ends of the first inner reinforcing member 3D11 and the first outer reinforcing member 3D12 and both ends of the second inner reinforcing member 3D13 and the second outer reinforcing member 3D14 are overlapped with one another to form the reinforcing body 3D1 with a rectangular annular shape.

The first inner reinforcing member 3D11, the first outer reinforcing member 3D12, the second inner reinforcing member 3D13, and the second outer reinforcing member 3D14 are each formed into a squared-U shape. The first inner reinforcing member 3D11 and the first outer reinforcing member 3D12 are disposed so as to be overlapped in the thickness direction displaced in the longitudinal direction. That is, the first inner reinforcing member 3D11 is overlapped with the first outer reinforcing member 3D12 such that the first inner reinforcing member 3D11 projects with respect to the first outer reinforcing member 3D12 at the one end T11 and the first outer reinforcing member 3D12 projects with respect to the first inner reinforcing member 3D11 at the other end T12.

The second inner reinforcing member 3D13 and the second outer reinforcing member 3D14 are also disposed so as to be overlapped in the thickness direction displaced in the longitudinal direction. That is, the second inner reinforcing member 3D13 is overlapped with the second outer reinforcing member 3D14 such that the second inner reinforcing member 3D13 projects with respect to the second outer reinforcing member 3D14 at the one end T21 and the second outer reinforcing member 3D14 projects with respect to the second inner reinforcing member 3D13 at the other end T22. With the above-described configuration, the outer surface at the one end T11 of the first inner reinforcing member 3D11 is opposed to the inner surface at the other end T22 of the second outer reinforcing member 3D14 during the clamping. Additionally, the inner surface at the other end T12 of the first outer reinforcing member 3D12 is opposed to the outer surface at the one end T21 of the second inner reinforcing member 3D13.

The first inner strip-shaped magnetic substance 3D21, the first outer strip-shaped magnetic substance 3D22, the second inner strip-shaped magnetic substance 3D31, and the second outer strip-shaped magnetic substance 3D32, similar to the first embodiment, for example, have the thin strip shape with a thickness of 100 µm or less and have flexibility. The first inner strip-shaped magnetic substance 3D21 is disposed so as to be laid along or be pasted to the outer surface of the first inner reinforcing member 3D11. The first outer strip-shaped magnetic substance 3D22 is disposed so as to be laid along or be pasted to the inner surface of the first outer reinforcing member 3D12. Accordingly, the first inner strip-shaped magnetic substance 3D21 and the first outer strip-shaped magnetic substance 3D22 are disposed so as to be interposed between the first inner reinforcing member 3D11 and the first outer reinforcing member 3D12 while overlapped in the thickness direction with one another. At this time, the position of the end of the first inner reinforcing member 3D11 and the position of the end of the first outer reinforcing member 3D12 are displaced from one another such that the outer surface at the one end T11 of the first inner strip-shaped magnetic substance 3D21 and the inner surface at the other end T12 of the first outer strip-shaped magnetic substance 3D22 are exposed. The first inner strip-shaped magnetic substance 3D21 and the first outer strip-shaped magnetic substance 3D22 are overlapped with and are in contact with one another to be magnetically coupled strongly, behaving as if were one magnetic substance.

The second inner strip-shaped magnetic substance 3D31 is disposed so as to be laid along or be pasted to the outer surface of the second inner reinforcing member 3D13. The second outer strip-shaped magnetic substance 3D32 is disposed so as to be laid along or be pasted to the inner surface of the second outer reinforcing member 3D14. Accordingly, the second inner strip-shaped magnetic substance 3D31 and the second outer strip-shaped magnetic substance 3D32 are disposed so as to be interposed between the second inner reinforcing member 3D13 and the second outer reinforcing member 3D14 while overlapped in the thickness direction with one another. At this time, the position of the end of the second inner reinforcing member 3D13 and the position of the end of the second outer reinforcing member 3D14 are displaced from one another such that the outer surface at the one end T21 of the second inner strip-shaped magnetic substance 3D31 and the inner surface at the other end T22 of the second outer strip-shaped magnetic substance 3D32 are exposed. The second inner strip-shaped magnetic substance 3D31 and the second outer strip-shaped magnetic substance 3D32 are overlapped with and are in contact with one another to be magnetically coupled strongly, behaving as if were one magnetic substance.

In view of this, as illustrated in FIG. 12, overlapping both ends of the first inner reinforcing member 3D11 and the first outer reinforcing member 3D12 with both ends of the second inner reinforcing member 3D13 and the second outer reinforcing member 3C14 overlaps the outer surface at the one end T11 of the first inner strip-shaped magnetic substance 3D21 and the inner surface at the other end T22 of the second outer strip-shaped magnetic substance 3D32 in the thickness direction, and the outer surface and the inner surface are in contact with one another. Furthermore, the inner surface at the other end T12 of the first outer strip-shaped magnetic substance 3D22 and the outer surface at the one end T21 of the second inner strip-shaped magnetic substance 3D31 are overlapped in the thickness direction and are in contact with one another.

The above-described fourth embodiment, similar to the second embodiment, allows opening and closing the sensor head 2 by one action, only the rotation of the right core 20R. This ensures simplifying the mechanism to achieve the opening and the closing operations of the sensor head 2. Consequently, the number of components can be reduced. Furthermore, this can reduce the cost, the occupied volume, and the risk of the failure.

Fifth Embodiment

Figure 13A:
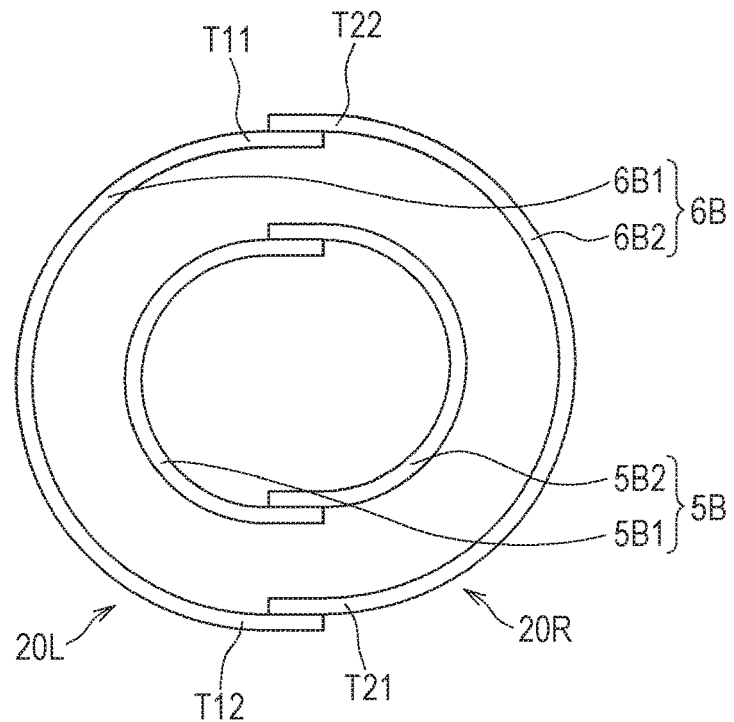
FIG. 13A is a side view of an inner magnetism collector and an outer magnetism collector illustrated in FIG. 1 during the clamping of a fifth embodiment.
Figure 13B:
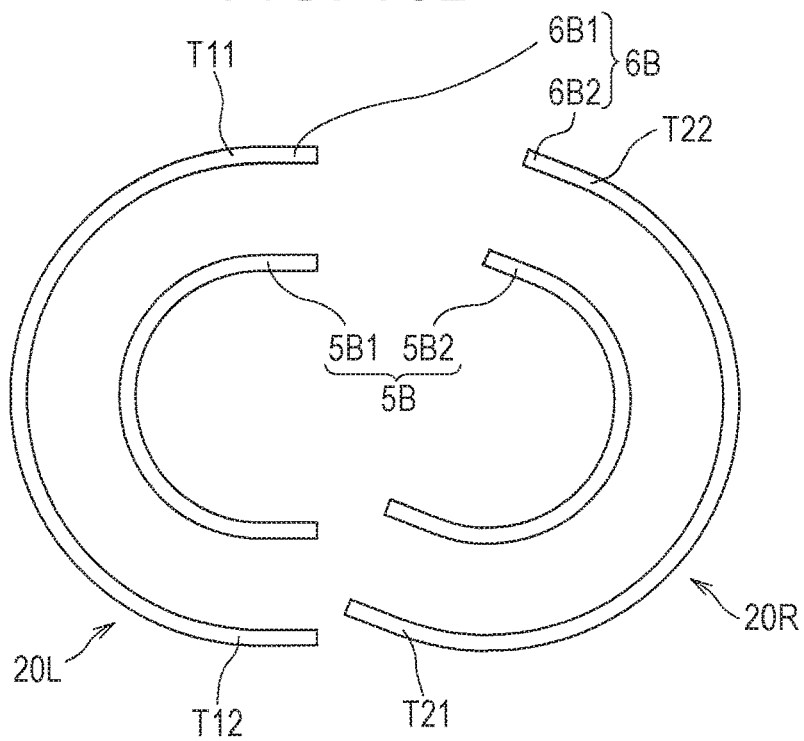
FIG. 13B is a side view of the inner magnetism collector and the outer magnetism collector illustrated in FIG. 1 during the non-clamping of the fifth embodiment.

The following describes the contactless type current sensor 1 of the fifth embodiment with reference to FIGS. 13A and 13B. The differences between the first to the fourth embodiments and the fifth embodiment are configurations of an inner magnetism collecting body 5B and an outer magnetism collecting body 6B. The parts other than the inner magnetism collecting body 5B and the outer magnetism collecting body 6B are similar to any one of the first to the fourth embodiments, and therefore will not be further elaborated here.

The inner magnetism collecting body 5B includes a first inner magnetism collector 5B1 as the first magnetism collector and a second inner magnetism collector 5B2 as the second magnetism collector. The outer magnetism collecting body 6B includes a first outer magnetism collector 6B1 as the first magnetism collector and a second outer magnetism collector 6B2 as the second magnetism collector.

The first inner magnetism collector 5B1 and the second inner magnetism collector 5B2 have a strip plate shape (a strip shape). The first inner magnetism collector 5B1 and the second inner magnetism collector 5B2 are formed into a U shape such that both ends in the longitudinal direction are opposed. The first inner magnetism collector 5B1 and the second inner magnetism collector 5B2 have the sizes and the shapes identical to one another. As illustrated in FIGS. 13A and 13B, the outer surface at the one end T11 (one of both ends) of the first inner magnetism collector 5B1 is overlapped with the inner surface at the other end T22 (one of both ends) of the second inner magnetism collector 5B2 so as to be opposed to one another.

Furthermore, the inner surface at the other end T12 (the other among both ends) of the first inner magnetism collector 5B1 is overlapped with the outer surface at the one end T21 (the other among both ends) of the second inner magnetism collector 5B2 so as to be opposed to one another. This forms the annular inner magnetism collecting body 5B.

The first outer magnetism collector 6B1 and the second outer magnetism collector 6B2 have a strip plate shape (a strip shape). The first outer magnetism collector 6B1 and the second outer magnetism collector 6B2 are formed into the U shape such that both ends in the longitudinal direction are opposed in the thickness direction. The first outer magnetism collector 6B1 and the second outer magnetism collector 6B2 have the sizes and the shapes identical to one another. As illustrated in FIGS. 13A and 13B, the outer surface at the one end T11 (one of both ends) of the first outer magnetism collector 6B1 is overlapped with the inner surface at the other end T22 (one of both ends) of the second outer magnetism collector 6B2 so as to be opposed to one another. Furthermore, the inner surface at the other end T12 (the other among both ends) of the first outer magnetism collector 6B1 is overlapped with the outer surface at the one end T21 (the other among both ends) of the second outer magnetism collector 6B2 so as to be opposed to one another. This forms the annular outer magnetism collecting body 6B.

With the above-described fifth embodiment, the inner magnetism collecting body 5B (the outer magnetism collecting body 6B) can also be detached in two by one action, for example, only the rotation of the second inner magnetism collector 5B2 (the second outer magnetism collector 6B2). Accordingly, especially, the application of the fifth embodiment to any one of the second to the fourth embodiments, for example, allows opening and closing the sensor head 2 (especially the inner magnetism collecting body 5B and the outer magnetism collecting body 6B) by the one action, only the rotation of the right core 20R. Moreover, since the contact between the first inner magnetism collector 5B1 and the second inner magnetism collector 5B2 and the contact between the first outer magnetism collector 6B1 and the second outer magnetism collector 6B2 become the contact by the surfaces, thereby ensuring increasing the contacted areas.

The above-described first to fifth embodiments describe the example where the strip-shaped magnetic substances (reference numerals are omitted) are each formed of the one strip-shaped magnetic substance. However, the configuration of the strip-shaped magnetic substance is not limited to this. For example, the strip-shaped magnetic substance may be configured by pasting a plurality of strip-shaped magnetic substances along the longitudinal direction and overlapping the plurality of strip-shaped magnetic substances in the thickness direction.

The respective embodiments described above merely illustrate representative configurations of the technique of the present disclosure. The technique of the disclosure is not limited to the embodiments. That is, the above-described embodiments can be modified in various ways following the conventional knowledge without departing from the gist of the technique of the disclosure. Thus modified embodiments are certainly included in the scope of the technique of the disclosure as long as the technique of the disclosure is included.

With this embodiment, the sensor head 2 includes the inner magnetism collecting body 5A (5B) and the outer magnetism collecting body 6A (6B). However, the configuration is not limited to this. The sensor head 2 may include one of the inner magnetism collecting body 5A (5B) and the outer magnetism collecting body 6A (6B).

The current sensor 1 may include any one of the excitation cores 3A to 3D and the current detecting circuit 10.

The embodiments of the present disclosure may be the following first to fifth excitation cores, first and second sensor heads, and first current sensor.

The first excitation core is an excitation core that includes a first strip-shaped magnetic substance and a second strip-shaped magnetic substance dividable into two. Both ends of the first strip-shaped magnetic substance and the second strip-shaped magnetic substance are in contact with one another to form the annular excitation core. The Both ends of the first strip-shaped magnetic substance and the second strip-shaped magnetic substance are overlapped and in contact with one another in a thickness direction.

In the second excitation core according to the first excitation core, the excitation core further includes a reinforcing body made of a non-magnetic material and constituted of a first reinforcing member and a second reinforcing member dividable into two. Both ends of the first reinforcing member and the second reinforcing member are overlapped with one another to form the annular reinforcing body. The first strip-shaped magnetic substance is disposed on the first reinforcing member. The second strip-shaped magnetic substance is disposed on the second reinforcing member.

In the third excitation core according to the second excitation core, the first reinforcing member has inner surfaces at the both ends overlapped with outer surfaces at the both ends of the first reinforcing member to be opposed. The first strip-shaped magnetic substance is disposed on an inner surface of the first reinforcing member. The second strip-shaped magnetic substance is disposed on an outer surface of the second reinforcing member.

In the fourth excitation core according to the second excitation core, the first reinforcing member and the second reinforcing member each form a through-hole. The first strip-shaped magnetic substance passes through the through-hole on the first reinforcing member and is disposed on an outer surface at one end of the first reinforcing member and on an inner surface at another end of the first reinforcing member. The second strip-shaped magnetic substance passes through the through-hole on the second reinforcing member and is disposed on an outer surface at one end of the second reinforcing member and on an inner surface at another end of the second reinforcing member. The first reinforcing member has the outer surface at the one end overlapped with the inner surface at the other end of the second reinforcing member to be opposed. The first reinforcing member has the inner surface at the other end overlapped with the outer surface at the one end of the second reinforcing member to be opposed.

In the fifth excitation core according to the second excitation core, pairs of the first reinforcing members and the second reinforcing members are each disposed overlapped in the thickness direction. The first strip-shaped magnetic substance is disposed interposed between the pair of first reinforcing members. The second strip-shaped magnetic substance is disposed interposed between the pair of second reinforcing members. Respective positions of ends of the pair of first reinforcing members are disposed to be displaced such that an outer surface at one end and an inner surface at another end of the first strip-shaped magnetic substance are exposed. Respective positions of ends of the pair of first reinforcing members are disposed to be displaced such that an outer surface at one end and an inner surface at another end of the second strip-shaped magnetic substance are exposed. The outer surface at the one end of the first strip-shaped magnetic substance is in contact with the inner surface at the other end of the second strip-shaped magnetic substance. The inner surface at the other end of the first strip-shaped magnetic substance is in contact with an inner surface at one end of the second strip-shaped magnetic substance.

The first sensor head includes any one of the first to the fifth excitation cores and a magnetism collecting body. The magnetism collecting body is constituted of strip-shaped first magnetism collector and second magnetism collector. Both ends of the first magnetism collector and the second magnetism collector are in contact with one another to form the annular magnetism collecting body. The magnetism collecting body is disposed at an inside or an outside of the reinforcing body.

In the second sensor head according to the first sensor head, the first magnetism collector has an outer surface at one of the both ends opposed to an inner surface at one of the both ends of the second magnetism collector. The first magnetism collector has an inner surface at another of the both ends overlapped with an outer surface at another of the both ends of the second magnetism collector to be opposed.

The first current sensor includes any one of the first to the fifth excitation cores and a current detector configured to detect a current flowing through a measurement target penetrating the excitation core.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. An excitation core comprising:
a first strip-shaped structure with a thickness of 100 micron or less and comprising a magnetic substance; and
a second strip-shaped structure with a thickness of 100 micron or less and comprising a magnetic substance, wherein
the first strip-shaped structure has a lengthwise extending outer surface and a lengthwise extending inner surface and comprises a magnetic substance and the second strip-shaped structure has a lengthwise extending outer surface and a lengthwise extending inner surface and comprises a magnetic substance,
wherein the inner and outer surfaces of the first and second strip-shaped structures at both ends are mutually overlapped with and mutually in contact with each other in a thickness direction.

2. An excitation core comprising:
a first strip-shaped magnetic substance having two ends;
a second strip-shaped magnetic substance having two ends, and
a reinforcing body that includes a first reinforcing member and a second reinforcing member made of a non-magnetic material, the both ends of the first reinforcing member and the both ends of the second reinforcing member being overlapped with one another to form the annular reinforcing body,
wherein:
the first strip-shaped magnetic substance is disposed on the first reinforcing member and has the both ends mutually overlapped with and mutually in contact with the both ends of the second strip-shaped magnetic substance in a thickness direction, and
the second strip-shaped magnetic substance is disposed on the second reinforcing member.

3. The excitation core according to claim 2, wherein:
the first reinforcing member has inner surfaces at the both ends overlapped with outer surfaces at the both ends of the second reinforcing member to be opposed to one another,
the first strip-shaped magnetic substance is disposed on an inner surface of the first reinforcing member, and
the second strip-shaped magnetic substance is disposed on an outer surface of the second reinforcing member.

4. The excitation core according to claim 2, wherein:
the first reinforcing member and the second reinforcing member each have a through-hole,
the first strip-shaped magnetic substance passes through the through-hole on the first reinforcing member and is disposed on an outer surface at one end of the first reinforcing member and on an inner surface at another end of the first reinforcing member,
the second strip-shaped magnetic substance passes through the through-hole on the second reinforcing member and is disposed on an outer surface at one end of the second reinforcing member and on an inner surface at another end of the second reinforcing member,
the first reinforcing member has the outer surface at the one end overlapped with the inner surface at the other end of the second reinforcing member to be opposed to one another, and
the first reinforcing member has the inner surface at the other end overlapped with the outer surface at the one end of the second reinforcing member to be opposed to one another.

5. The excitation core according to claim 2, wherein:
the first reinforcing member includes a first inner reinforcing member and a first outer reinforcing member overlapped with one another in a thickness direction,
the second reinforcing member includes a second inner reinforcing member and a second outer reinforcing member overlapped with one another in a thickness direction,
the first strip-shaped magnetic substance is interposed between the first inner reinforcing member and the first outer reinforcing member,
the second strip-shaped magnetic substance is interposed between the second inner reinforcing member and the second outer reinforcing member,
a position of an end of the first inner reinforcing member and a position of an end of the first outer reinforcing member are displaced from one another such that an outer surface at one end and an inner surface at another end of the first strip-shaped magnetic substance are exposed, a position of an end of the second inner reinforcing member and a position of an end of the second outer reinforcing member are displaced from one another such that an outer surface at one end and an inner surface at another end of the second strip-shaped magnetic substance are exposed, and the outer surface at the one end of the first strip-shaped magnetic substance and the inner surface at the other end of the second strip-shaped magnetic substance are in contact with one another, and the inner surface at the other end of the first strip-shaped magnetic substance and the outer surface at the one end of the second strip-shaped magnetic substance are in contact with one another.

6. A sensor head, comprising:
the excitation core according to claim 2; and
a magnetism collecting body that includes strip-shaped first magnetism collector and second magnetism collector, the first magnetism collector having both ends mutually in contact with both ends of the second magnetism collector to form the annular magnetism collecting body, the magnetism collecting body being disposed at an inside or an outside of the reinforcing body.

7. The sensor head according to claim 6, wherein:
the first magnetism collector has an outer surface at one of the both ends overlapped with an inner surface at one of the both ends of the second magnetism collector to be opposed to one another, and the first magnetism collector has an inner surface at another of the both ends overlapped with an outer surface at another of the both ends of the second magnetism collector to be opposed to one another.

8. A current sensor, comprising:
the excitation core according to claim 1; and
a current detector configured to detect a current flowing through a measurement target penetrating the excitation core.

\* \* \* \* \*